(12) United States Patent
Chauhan et al.

(10) Patent No.: US 7,525,865 B2
(45) Date of Patent: Apr. 28, 2009

(54) CONTROL CIRCUIT FOR REFRESHING VOLTAGES IN A NON-VOLATILE MEMORY DURING A STANDBY MODE AND A METHOD THEREOF

(75) Inventors: Bharat Chauhan, Cordova, CA (US);
Gerald Barkley, Oregon, WI (US);
Kerry D. Tedrow, Folsom, CA (US);
Balaji Sivakumar, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 109 days.

(21) Appl. No.: 11/771,582

(22) Filed: Jun. 29, 2007

(65) Prior Publication Data
US 2009/0003116 A1 Jan. 1, 2009

(51) Int. Cl.
*G11C 5/14* (2006.01)
(52) U.S. Cl. .............. 365/229; 365/189.07; 365/189.09; 365/233.15
(58) Field of Classification Search ................... 365/229, 365/189.07, 189.09, 226, 233.15, 241, 210.11
See application file for complete search history.

(56) References Cited

U.S. PATENT DOCUMENTS 5,854,615 A * 12/1998 Hush ............................ 345/99

* cited by examiner

*Primary Examiner*—Thong Q Le
(74) *Attorney, Agent, or Firm*—Grossman, Tucker, Perreault & Pfleger, PLLC

(57) ABSTRACT

Disclosed is a method for refreshing voltages in a non volatile memory during a standby mode. The method comprises generating a first node voltage and a second node voltage through a resistance ladder, storing the voltages in a pair of capacitors, comparing the voltages by a comparator, generating an output electrical signal by the comparator upon comparing the voltages, latching the output electrical signal by a flip flop, generating an electrical refresh pulse by a refresh pulse generator upon receiving the output electrical signal from the flip flop, the electrical refresh pulse being supplied to a refresh node of a plurality of refresh nodes in the non volatile memory and generating an electrical sample pulse by a sample pulse generator, the electrical sample pulse along with the electrical refresh pulse setting the flip flop, thereby causing the flip flop to latch a new output electrical signal.

9 Claims, 3 Drawing Sheets

CONTROL CIRCUIT FOR REFRESHING VOLTAGES IN A NON-VOLATILE MEMORY DURING A STANDBY MODE AND A METHOD THEREOF

FIELD

The present disclosure relates to refreshing schemes in a non volatile memory and, more particularly, to a control circuit for refreshing voltages in the non volatile memory during a standby mode.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION

For a thorough understanding of the present disclosure, reference is to be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items.

Figure 1:
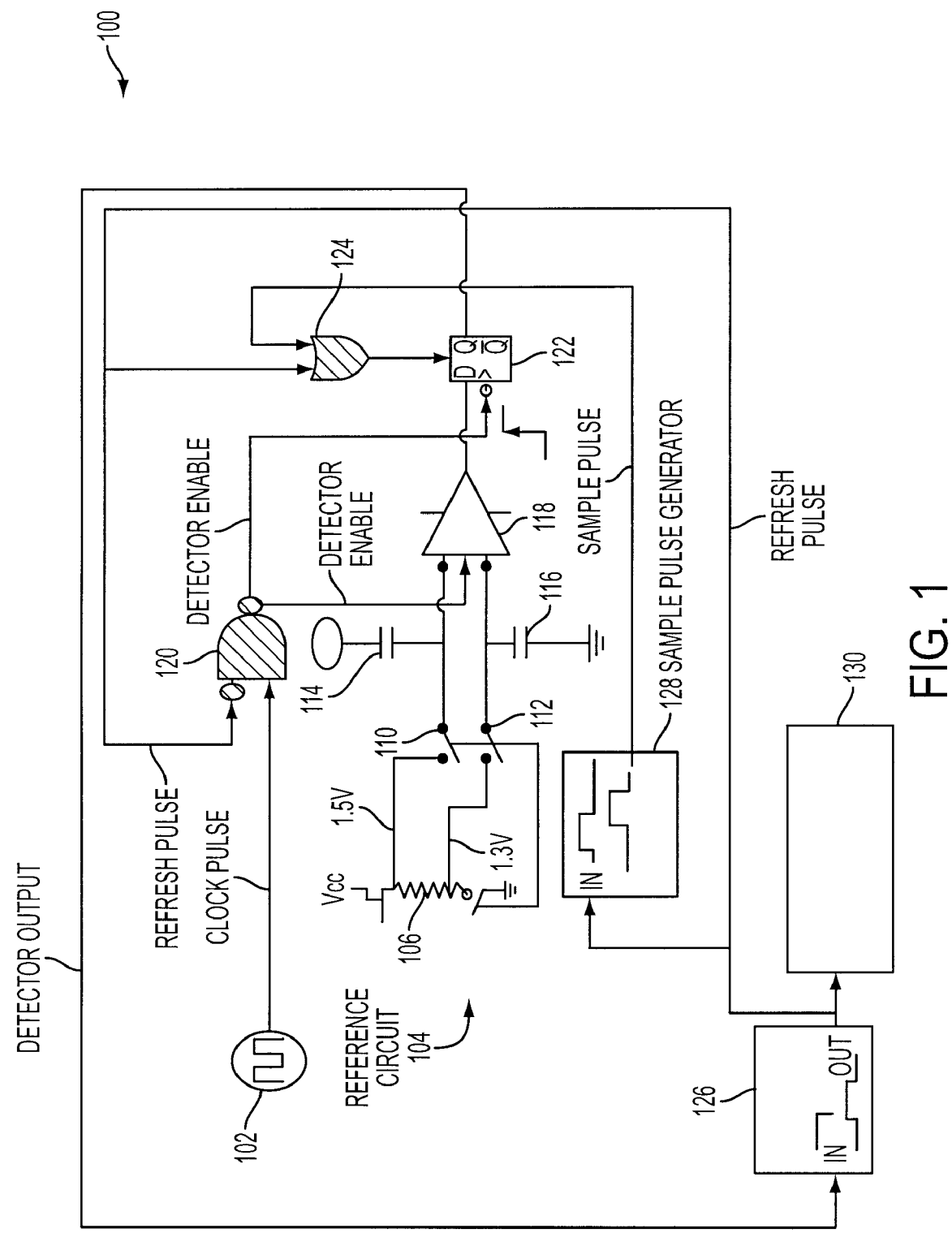
FIG. 1 is a diagram illustrating a control circuit for refreshing voltages in a non volatile memory during a standby mode, according to an exemplary embodiment of the present disclosure.

FIG. 1 is a diagram illustrating a control circuit 100 for refreshing voltages in a non volatile memory during a standby mode. The examples of non volatile memory include but are not limited to a hard disk, a floppy disk drive, a magnetic tape and a Flash memory. The control circuit 100 includes a Resistive Capacitive (RC) oscillator 102, a node detector circuit, a refresh pulse generator 126, a detector circuit 120 and a sample pulse generator 128.

The RC oscillator 102 generates a clock pulse. The clock pulse is used as one of an input to the detector circuit 120 and a frequency of the RC oscillator 102 is determined based on a parameter. The parameter is based on a voltage tolerance and a standby current. The node detector circuit includes a reference circuit 104, a sample capacitor 114, a reference capacitor 116, and a comparator 118. The reference circuit 104 is used for setting a voltage tolerance through a resistance ladder 106. For example, a node voltage of 1.5V is generated using the resistance ladder 106 on a det node 110 and a node voltage of 1.3V is generated using the resistance ladder 106 on a ref node 112. The difference of the node voltages between the det node 110 and the ref node 112 is more important than a real value of the node voltages at the det node 110 and the ref node 112. The voltage tolerance is set through a voltage supply $V_{CC}$, which is a source follower. The node voltage at the det node 110 is stored in the sample capacitor 114 and the node voltage at the ref node 112 is stored in the reference capacitor 116. The node voltage at the det node 110 and the node voltage at the ref node 112 are used as inputs to the comparator 118. The node voltage at the det node 110 and the node voltage at the ref node 112 are derived from the same resistance ladder 106, therefore, the voltage difference between the det node 110 and the ref node 112 due to temperature variation and process variation is minimal.

The comparator 118 compares the node voltage at the det node 110 and the node voltage at the ref node 112, and generates an output electrical signal when the node voltage at the det node 110 is less than the node voltage at the ref node 112. The output electrical signal is latched on a flip flop 122, for example, a D flip flop. The output of the flip flop 122 acts as an input signal to the refresh pulse generator 126. The refresh pulse generator 126 generates an electrical refresh pulse after receiving the output electrical signal from the flip flop 122. The electrical refresh pulse is supplied to a refresh node 130 of a plurality of refresh nodes of the non volatile memory, thereby refreshing voltages in the non volatile memory during the standby mode. As a result, the non volatile memory may be read instantly after coming out of the standby mode.

The detector circuit 120 is used for enabling the control circuit 100. The detector circuit 120 includes an AND gate. An input signal to the AND gate is the clock pulse generated by the RC oscillator 102 and the electrical refresh pulse generated by the refresh pulse generator 126. An output signal of the AND gate is used for enabling the comparator 118 and the flip flop 122. Further, the output signal of the AND gate acts as a clock signal for the flip flop 122. The control circuit further includes an OR gate 124 and the output signal of the OR gate 124 is used as an input signal for setting the flip flop 122, thereby causing the flip flop 122 to latch a new output electrical signal. Therefore, a new set of the node voltage at the det node 110 and the node voltage at the ref node 112 is set.

The terminal of capacitor 114 that is coupled to the "sample node" is the node that may be sampled. The sample node, in operation, may droop at a much higher rate than the reference node. Thus, the voltage across capacitor 114 may force the detection node to fall below the reference node and trip the detector when the clock pulse 102 enables the comparator 118 and the flip-flop 122. When the comparator 118 is tripped (Vdet<Vref), a refresh pulse 126 may refresh the sample node of the capacitor 114, the reference circuit 104, the detection node 110 and the reference node 112. circuit 104

Figure 2:
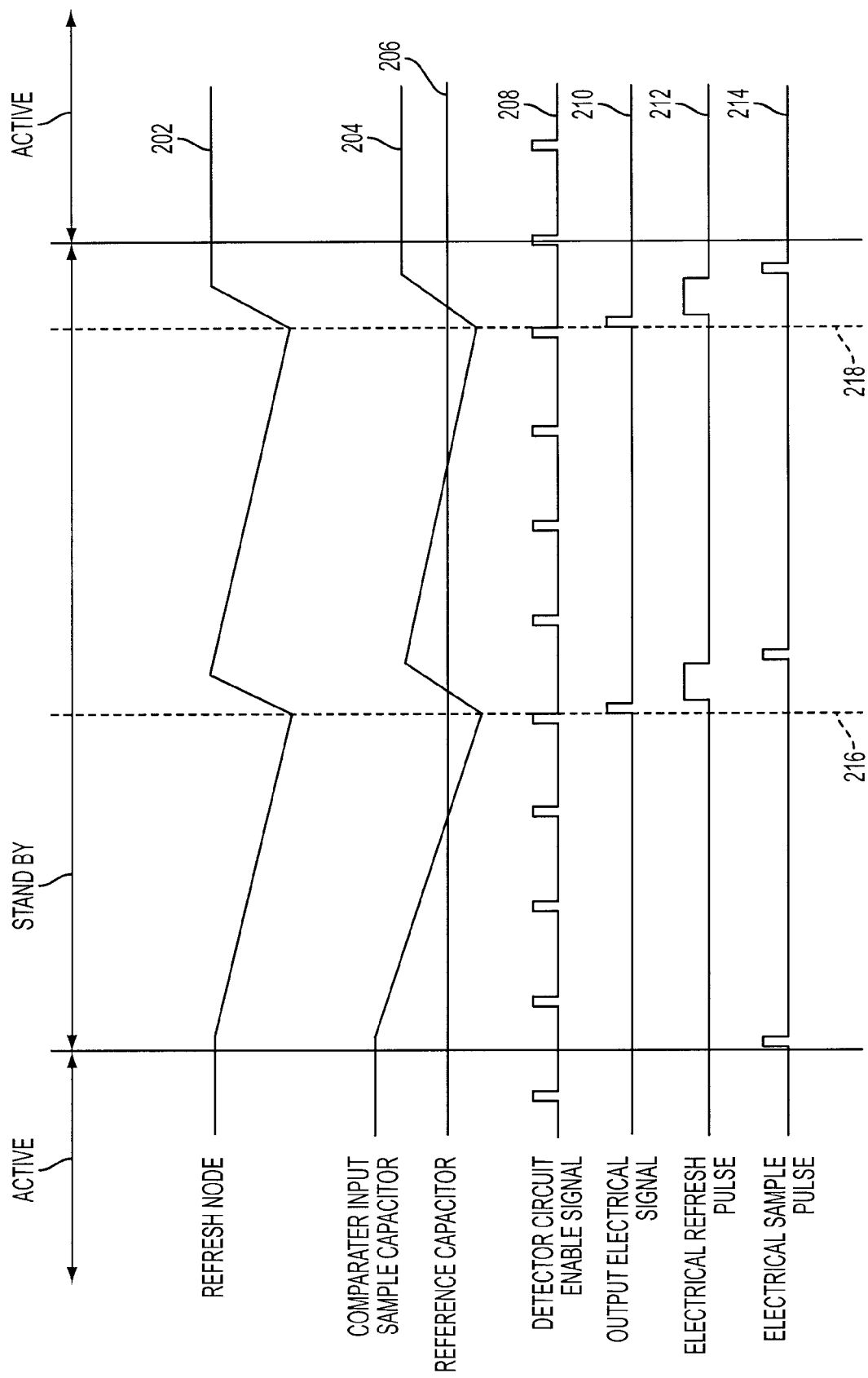
FIG. 2 is a timing diagram of the control circuit for refreshing voltages in the non volatile memory during the standby mode, according to an exemplary embodiment of the present disclosure.

FIG. 2 is a timing diagram of the control circuit 100 for refreshing voltages in the non volatile memory during a standby mode. During the standby mode, the voltage at the refresh node 130 decreases, as shown with reference to a signal 202. The node voltage at the sample capacitor 114 is shown with reference to a signal 204. The node voltage at the reference capacitor 116 is shown with reference to a signal 206. A detector circuit enable signal 208 illustrates the output signal of the detector circuit 120. When the detector circuit 120 is enabled at time 216 and the node voltage at the det node 110 is less than the node voltage at the ref node 112 at the time 216, then the output electrical signal 210 is generated. Thereafter, the electrical refresh pulse 212 is generated by the refresh pulse generator 126. Next, the electrical sample pulse 214 is generated by the sample pulse generator 128. At time 218, when the detector circuit 120 is enabled and when the node voltage at the det node 110 is less than the node voltage at the ref node 112, then a new output electrical signal, a new electrical refresh pulse, and a new electrical sample pulse are generated.

Figure 3:
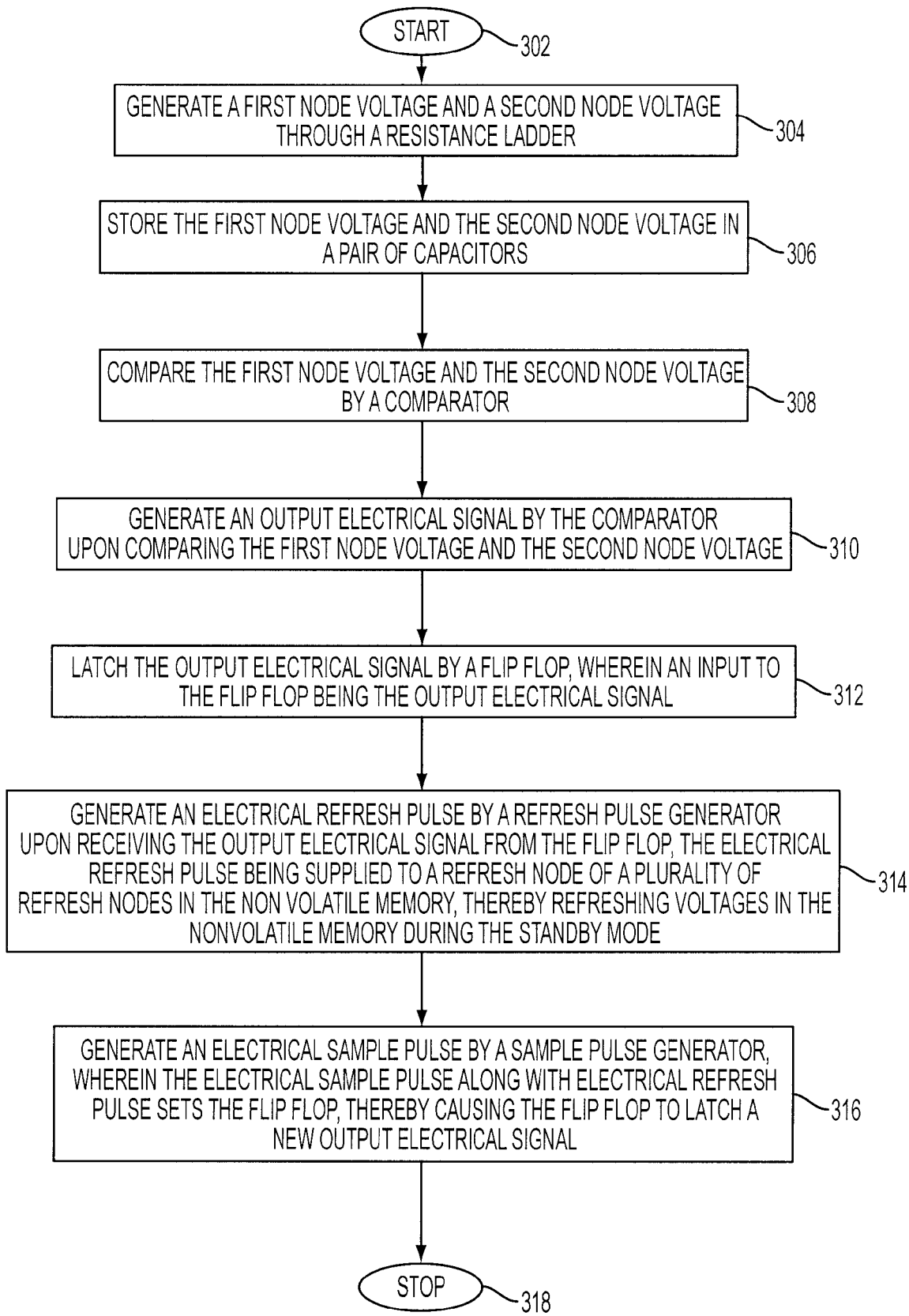
FIG. 3 is a flow diagram of a method for refreshing voltages in the non volatile memory during the standby mode, according to an exemplary embodiment of the present disclosure.

FIG. 3 is a flow diagram of a method for refreshing voltages in the non volatile memory during the standby mode. The method is initiated at 302, when the non volatile memory changes from an active mode to the standby mode. At 304, two node voltages are generated through the resistance ladder 106, the two node voltages being the node voltage at the det node 110 or a first node voltage and the node voltage at the ref node 112 or a second node voltage. At 306, the two node voltages are stored in a pair of capacitors, the pair of capacitors is the sample capacitor 114 and the reference capacitor 116. At 308, the node voltage at the det node 110 and the node voltage at the ref node 112 are compared by the comparator 118.

At 310, the output electrical signal 210 is generated by the comparator 118 based on comparing the node voltage at the det node 110 and the node voltage at the ref node 112. At 312, the output electrical signal 210 is latched in the flip flop 122. At 314, the electrical refresh pulse 212 is generated by the refresh pulse generator 126 upon receiving the output electrical signal 210 from the flip flop 122. The electrical refresh pulse 212 is supplied to the refresh node 130 of the plurality of refresh nodes in the non volatile memory, thereby refreshing voltages in the non volatile memory during the standby mode. At 316, the electrical sample pulse 214 is generated by the sample pulse generator 128 and the electrical sample pulse 214 along with the electrical refresh pulse 212 is used to get new output electrical signal that may be latched in the flip flop 122. Thereby, a new set of the node voltage at the det node 110 and the node voltage at the ref node 112 is set. The method terminates at 318.

The leakage on the refresh node 130 decreases exponentially when temperature decreases, when process changes from fast to slow, or when the supply voltage $V_{CC}$ decreases. The disclosure provides a method for detecting the leakage and refreshing the voltage based on the voltage tolerance and standby requirements. Therefore, the control circuit 100 for the non volatile memory provides an efficient way of conserving standby current during variations in temperature, process and voltage.

The foregoing descriptions of specific embodiments of the present disclosure have been presented for the purposes of illustration and description. They are not intended to be exhaustive or to limit the disclosure to the precise forms disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such modifications are intended to cover the application or implementation without departing from the spirit or scope of the claims of the present disclosure.

What is claimed is:

1. A control circuit for refreshing voltages in a non volatile memory during a standby mode, the control circuit comprising:
   a Resistive Capacitive (RC) oscillator capable of generating a clock pulse for enabling the control circuit;
   a node detector circuit comprising,
      a reference circuit capable of setting a voltage tolerance, the voltage tolerance set through a resistance ladder by a source voltage supply thereby generating a first node voltage and a second node voltage,
      a pair of capacitors capable of storing the first node voltage and the second node voltage, and
      a comparator for comparing the first node voltage and the second node voltage and generating an output electrical signal upon comparing the first node voltage and the second node voltage;
   a flip flop for latching the output electrical signal, wherein the output electrical signal acts as an input to the flip flop;
   a refresh pulse generator capable of generating an electrical refresh pulse upon receiving the output electrical signal from the flip flop, the electrical refresh pulse being supplied to a refresh node of a plurality of refresh nodes of the non volatile memory, thereby refreshing voltages in the non volatile memory during the standby mode;
   a detector circuit for enabling the comparator and the flip flop, wherein inputs to the detector circuit are the clock pulse from the RC oscillator and the electrical refresh pulse; and
   a sample pulse generator for generating an electrical sample pulse, the electrical sample pulse along with the electrical refresh pulse setting the flip flop, thereby causing the flip flop to latch a new output electrical signal.

2. The control circuit of claim 1, wherein the electrical sample pulse is generated after receiving the electrical refresh pulse from the refresh pulse generator.

3. The control circuit of claim 1, wherein the source voltage supply is a source follower.

4. The control circuit of claim 1, wherein the non volatile memory is a flash memory.

5. The control circuit of claim 1, wherein the output electrical signal is generated when the first node voltage is less than the second node voltage.

6. A method for refreshing voltages in a non volatile memory during a standby mode, the method comprising:
   generating a first node voltage and a second node voltage through a resistance ladder;
   storing the first node voltage and the second node voltage in a pair of capacitors;
   comparing the first node voltage and the second node voltage by a comparator;
   generating an output electrical signal by the comparator upon comparing the first node voltage and the second node voltage;
   latching the output electrical signal by a flip flop, wherein an input to the flip flop is the output electrical signal;
   generating an electrical refresh pulse by a refresh pulse generator upon receiving the output electrical signal from the flip flop, the electrical refresh pulse being supplied to a refresh node of a plurality of refresh nodes in the non volatile memory, thereby refreshing voltages in the non volatile memory during the standby mode; and
   generating an electrical sample pulse by a sample pulse generator, wherein the electrical sample pulse along with the electrical refresh pulse sets the flip flop, thereby causing the flip flop to latch a new output electrical signal.

7. The method of claim 6, wherein the electrical sample pulse is generated after receiving the electrical refresh pulse from the refresh pulse generator.

8. The method of claim 6, wherein the non volatile memory is a flash memory.

9. The method of claim 6, wherein the output electrical signal is generated when the first node voltage is less than the second node voltage.

* * * * *